(12) United States Patent
Hsu et al.

(10) Patent No.: US 11,948,920 B2
(45) Date of Patent: Apr. 2, 2024

(54) SEMICONDUCTOR DEVICE AND METHOD FOR MANUFACTURING THE SAME, AND SEMICONDUCTOR PACKAGE

(71) Applicant: Taiwan Semiconductor Manufacturing Company, Ltd., Hsinchu (TW)

(72) Inventors: I-Chun Hsu, Hsinchu (TW); Yan-Zuo Tsai, Hsinchu (TW); Chia-Yin Chen, Hsinchu (TW); Yang-Chih Hsueh, Hsinchu (TW); Yung-Chi Lin, New Taipei (TW); Tsang-Jiuh Wu, Hsinchu (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 135 days.

(21) Appl. No.: 17/461,971

(22) Filed: Aug. 30, 2021

(65) Prior Publication Data

US 2023/0063851 A1 Mar. 2, 2023

(51) Int. Cl.
*H01L 25/18* (2023.01)
*H01L 25/00* (2006.01)
*H01L 25/065* (2023.01)

(52) U.S. Cl.
CPC ...... *H01L 25/0657* (2013.01); *H01L 25/0652* (2013.01); *H01L 25/18* (2013.01); *H01L 25/50* (2013.01); *H01L 2225/06524* (2013.01); *H01L 2225/06544* (2013.01); *H01L 2225/06565* (2013.01)

(58) Field of Classification Search
CPC .......................... H01L 25/0657; H01L 25/18
See application file for complete search history.

(56) References Cited

U.S. PATENT DOCUMENTS

| | | | |
|---|---|---|---|
| 11,328,968 B2 * | 5/2022 | Modi | H01L 25/0657 |
| 2020/0258816 A1 * | 8/2020 | Okina | H10B 43/40 |
| 2021/0391302 A1 * | 12/2021 | Kao | H01L 24/08 |
| 2022/0399294 A1 * | 12/2022 | Dogiamis | H01L 24/80 |
| 2023/0154894 A1 * | 5/2023 | Hwang | H01L 24/05 257/621 |
| 2023/0187407 A1 * | 6/2023 | Molnar | H01L 25/18 257/777 |

* cited by examiner

*Primary Examiner* — Thao P Le
(74) *Attorney, Agent, or Firm* — JCIPRNET

(57) ABSTRACT

Provided are a semiconductor device and a method for manufacturing the same, and a semiconductor package. The semiconductor device includes a die stack and a cap substrate. The die stack includes a first die, second dies stacked on the first die, and a third die stacked on the second dies. The first die includes first through semiconductor vias. Each of the second dies include second through semiconductor vias. The third die includes third through semiconductor vias. The cap substrate is disposed on the third die of the die stack. A sum of a thickness of the third die and a thickness of the cap substrate ranges from about 50 μm to about 80 μm.

18 Claims, 8 Drawing Sheets

US 11,948,920 B2

SEMICONDUCTOR DEVICE AND METHOD FOR MANUFACTURING THE SAME, AND SEMICONDUCTOR PACKAGE

BACKGROUND

A High-Performance Computing (HPC) system often includes a high bandwidth memory (HBM) stack. The HBM stack includes memory dies stacked together, with higher memory dies bonded to the lower memory dies through solder or micro bumps. Through-silicon vias (TSVs) are formed in the memory dies, so that higher memory dies may be electrically connected to the lower memory dies through the TSVs. HBM has characteristics of great capacity and high-speed operation. However, while existing HBM has generally been adequate for their intended purposes, as the requirements for capacity and operation speed continue to increase, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
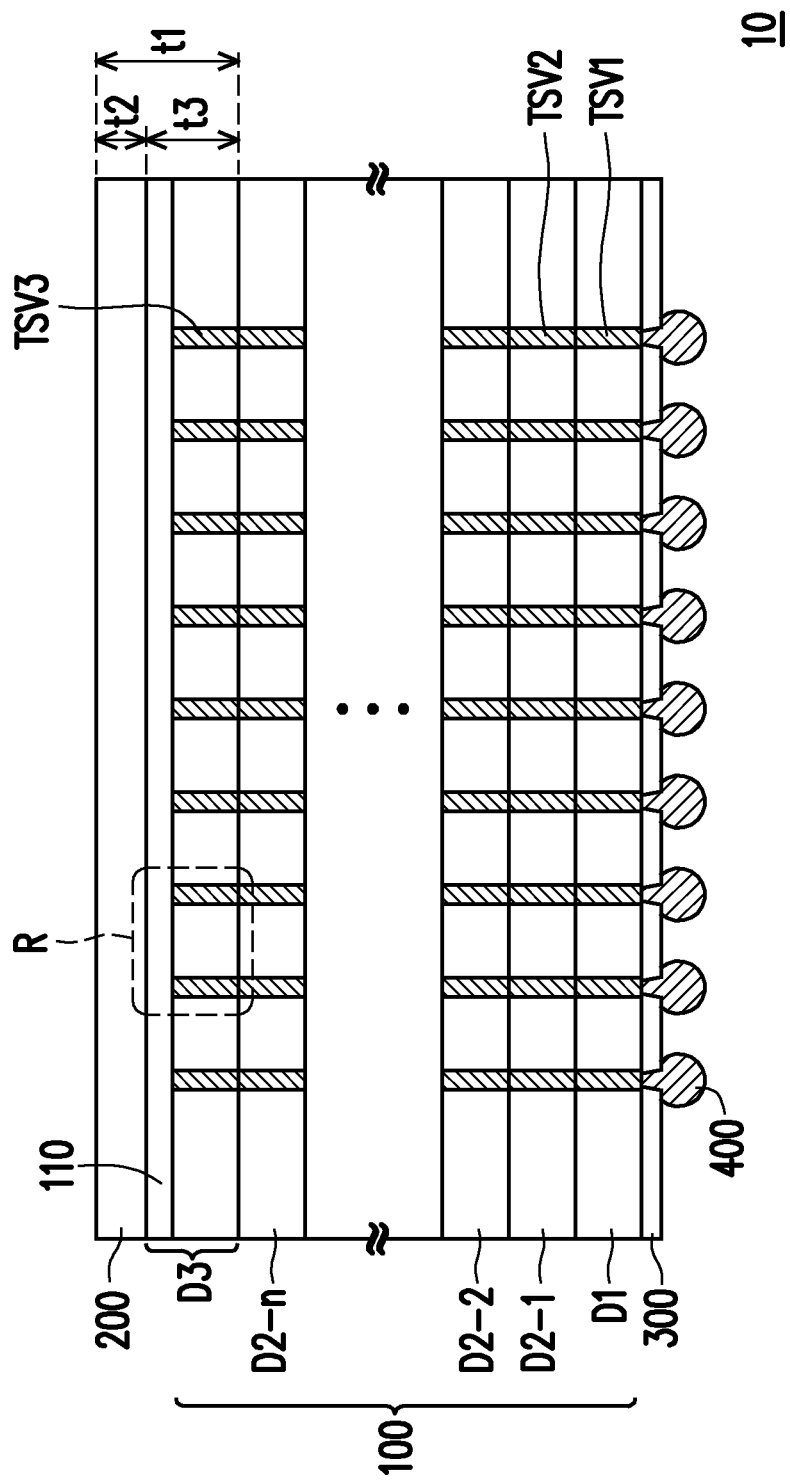
FIG. 1A is a schematic cross-section view illustrating a semiconductor device in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
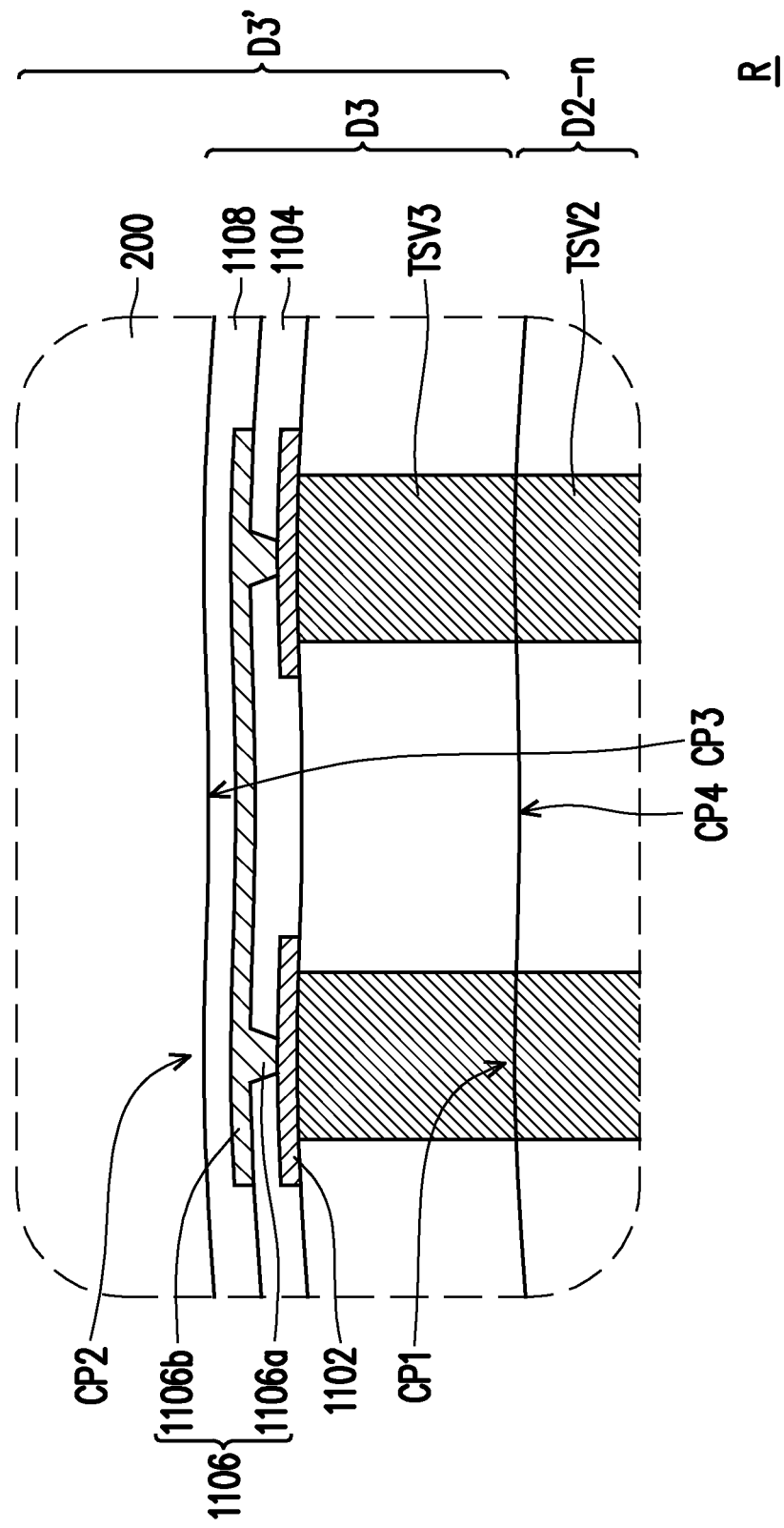
FIG. 1B is a schematic enlarge view illustrating a region R of FIG. 1A in accordance with the first embodiment.
Figure 2:
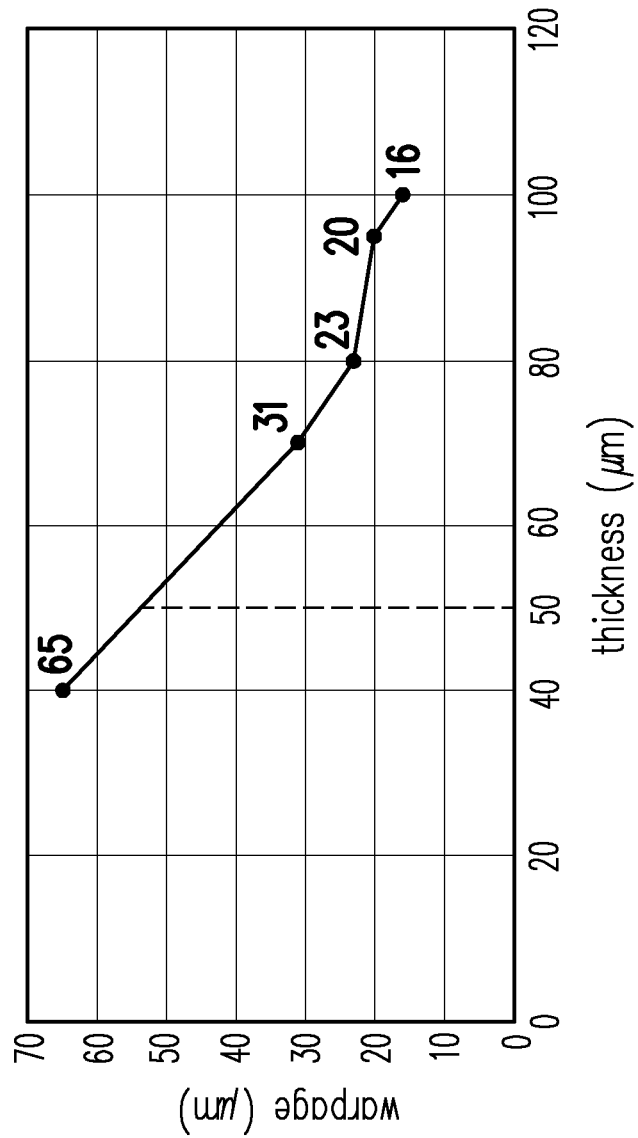
FIG. 2 is a diagram illustrating the relationship between a warpage value and a sum of a thickness of a cap substrate and a thickness of a topmost memory die on which the cap substrate is disposed among memory dies.
Figure 3:
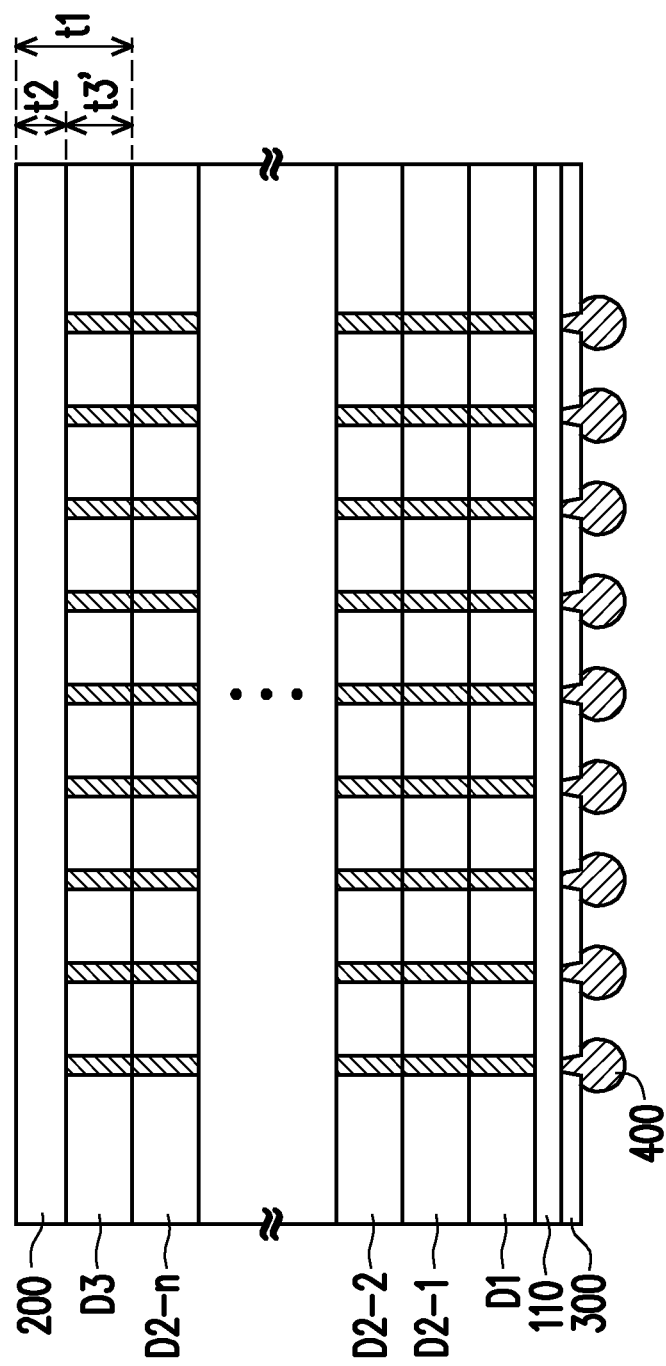
FIG. 3 is a schematic cross-section view illustrating a semiconductor device in accordance with a second embodiment.

FIG. 1A is a schematic cross-section view illustrating a semiconductor device in accordance with a first embodiment. FIG. 1B is a schematic enlarge view illustrating a region R of FIG. 1A in accordance with the first embodiment. FIG. 2 is a diagram illustrating the relationship between a warpage value and a sum of a thickness of a cap substrate and a thickness of a topmost memory die on which the cap substrate is disposed among memory dies. FIG. 3 is a schematic cross-section view illustrating a semiconductor device in accordance with a second embodiment.

Referring to FIG. 1A, a semiconductor device 10 includes a die stack 100 and a cap substrate 200 disposed on the die stack 100. In some embodiments, the die stack 100 includes a first die D1, second dies D2-1 to D2-$n$ ($n$ is a positive integer) stacked on the first die D1, and a third die D3 stacked on the second dies D2-1 to D2-$n$. The second dies D2-1 to D2-$n$ are stacked on each other. In some embodiments, each of the first die D1, second dies D2-1 to D2-$n$, and third die D3 may be a memory die, but is not limited thereto. In some alternative embodiments, the first die may be a logic die to control the second dies D2-1 to D2-$n$ and the third die D3, and each of the second dies D2 and third die D3 may be a memory die. Each of the first die D1, second dies D2-1 to D2-$n$, and third die D3 may include a cell region where memory cells are disposed and a connection region where connection members such as TSVs or pads are disposed. In some embodiments, the cell regions of the first die D1, second dies D2-1 to D2-$n$, and third die D3 are overlapped with each other in a top view of the die stack 100. In some embodiments, the connection regions of the first die D1, second dies D2-1 to D2-$n$, and third die D3 are overlapped with each other in a top view of the die stack 100. The cross-section view shown in FIG. 1A is a cross-section view taken from the connection region of the die stack 100, so devices in the memory cells are not illustrated.

The first die D1 includes first through semiconductor vias TSV1 configured in the connection region of the first die D1. Each of the second dies D2-1 to D2-$n$ includes second through semiconductor vias TSV2 configured in the connection region of the second die D2-1 to D2-$n$. The third die D3 includes third through semiconductor vias TSV3 configured in the connection region of the third die D3. The first die D1, second dies D2-1 to D2-$n$, and third die D3 are electrically connected with each other through the first through semiconductor vias TSV1, the second through semiconductor vias TSV2, and the third through semiconductor vias TSV3. In other words, the first through semiconductor vias TSV1, the second through semiconductor vias TSV2, and the third through semiconductor vias TSV3 may be consider as vertical electrical connection members of the die stack 100. The first through semiconductor vias TSV1, the second through semiconductor vias TSV2, and the third through semiconductor vias TSV3 may each include conductive materials, such as metals or metal alloys including one or more of Al, AlCu, Cu, Ti, TiN, W, and the like.

A bonding interface between a bottommost second die D2-1 among the second dies D2-1 to D2-*n* and the first die D1 may include metal-to-metal bonding interfaces. In some embodiments, as shown in FIG. 1A, the second through semiconductor vias TSV2 in a bottommost second die D2-1 among the second dies D2-1 to D2-*n* are directly in contact with the first through semiconductor vias TSV1 of the first die D1, but the metal-to-metal bonding interfaces are not limited to via-to-via bonding interfaces. In some alternative embodiments, the metal-to-metal bonding interfaces may include pad-to-pad bonding interfaces or via-to-pad bonding interfaces. The bonding interface between the bottommost second die D2-1 among the second dies D2-1 to D2-*n* and the first die D1 may include the metal-to-metal bonding interfaces and dielectric-to-dielectric bonding interfaces. For example, a surface of the bottommost second die D2-1 that faces the first die D1 may include first portions defined by the second through semiconductor vias TSV2 and a second portion defined by a dielectric layer (not shown) surrounding the second through semiconductor vias TSV2 in the bottommost second die D2-1. A surface of the first die that faces the bottommost second die D2-1 may include first portions defined by the first through semiconductor vias TSV1 and a second portion defined by a dielectric layer (not shown) surrounding the first through semiconductor vias TSV1 in the first die D1. The first portions and the second portion of the surface of the bottommost second die D2-1 that are respectively defined by the second through semiconductor vias TSV2 and the dielectric layer are directly in contact with the first portions and second portion of the surface of the first die D1 that are respectively defined by the first through semiconductor vias TSV1 and the dielectric layer, respectively.

The metal-to-metal bonding may include a pre-bonding and an anneal, so that metals in ones of metal components such as the first through semiconductor vias TSV1 inter-diffuse with metals in another respective ones of the metal components such as the second through semiconductor vias TSV2. The dielectric-to-dielectric bonding may include a pre-bonding and an anneal, so that one of dielectric components such as the dielectric layer surrounding the first through semiconductor vias TSV1 are bonded to another respective one of the dielectric components such as the dielectric layer surrounding the second through semiconductor vias TSV2 with covalent bonds (such as Si—O—Si bonds) generated.

A bonding interface between two adjacent second dies D2-1 to D2-*n* (e.g., a bonding interface between second dies D2-1 and D2-2) among the second dies D2-1 to D2-*n* may include metal-to-metal bonding interfaces. In some embodiments, as shown in FIG. 1A, the second through semiconductor vias TSV2 between the two adjacent second dies D2-1 and D2-2 among the second dies D2-1 to D2-*n* are directly in contact with each other, but the metal-to-metal bonding interfaces are not limited to via-to-via bonding interfaces. In some alternative embodiments, the metal-to-metal bonding interfaces may include pad-to-pad bonding interfaces or via-to-pad bonding interfaces. The bonding interface between the two adjacent second dies D2-1 to D2-*n* may include the metal-to-metal bonding interfaces and dielectric-to-dielectric bonding interfaces. For example, a surface of the second die D2-1 that faces the overlying second die D2-2 may include first portions defined by the second through semiconductor vias TSV2 and a second portion defined by a dielectric layer (not shown) surrounding the second through semiconductor vias TSV2 in the second die D2-1. A surface of the second die D2-2 that faces the second die D2-1 may include first portions defined by the second through semiconductor vias TSV2 and a second portion defined by a dielectric layer (not shown) surrounding the second through semiconductor vias TSV2 in the second die D2-2. The first portions and the second portion of the surface of the second die D2-1 that are respectively defined by the second through semiconductor vias TSV2 and the dielectric layer are directly in contact with the first portions and second portion of the surface of the second die D2-2 that are respectively defined by the second through semiconductor vias TSV2 and the dielectric layer, respectively.

A bonding interface between a topmost second die D2-*n* among the second dies D2-1 to D2-*n* and the third die D3 may include metal-to-metal bonding interfaces. In some embodiments, as shown in FIG. 1A, the second through semiconductor vias TSV2 in a topmost second die D2-*n* among the second dies D2-1 to D2-*n* are directly in contact with the third through semiconductor vias TSV3 of the third die D3, but the metal-to-metal bonding interfaces are not limited to via-to-via bonding interfaces. In some alternative embodiments, the metal-to-metal bonding interfaces may include pad-to-pad bonding interfaces or via-to-pad bonding interfaces. The bonding interface between the topmost second die D2-*n* among the second dies D2-1 to D2-*n* and the third die D3 may include the metal-to-metal bonding interfaces and dielectric-to-dielectric bonding interfaces. For example, a surface of the topmost second die D2-*n* that faces the third die D3 may include first portions defined by the second through semiconductor vias TSV2 and a second portion defined by a dielectric layer (not shown) surrounding the second through semiconductor vias TSV2 in the topmost second die D2-*n*. A surface of the third die D3 that faces the topmost second die D2-*n* may include first portions defined by the third through semiconductor vias TSV3 and a second portion defined by a dielectric layer (not shown) surrounding the third through semiconductor vias TSV3 in the third die D3. The first portions and the second portion of the surface of the topmost die D2-*n* that are respectively defined by the second through semiconductor vias TSV2 and the dielectric layer are directly in contact with the first portions and second portion of the surface of the third die D3 that are respectively defined by the third through semiconductor vias TSV3 and the dielectric layer, respectively.

The cap substrate 200 is disposed on the third die D3 of the die stack 100. A bonding interface between the cap substrate 200 and the third die D3 may include metal-to-metal bonding interfaces, dielectric-to-dielectric bonding interfaces, or combinations thereof. The cap substrate 200 may include a semiconductor substrate (e.g., Si substrate). In some embodiments, the cap substrate 200 may include layers such as dielectric layers disposed on the semiconductor substrate. In some embodiments, the cap substrate 200 may be bonded on the third die D3 before the third die D3 is stacked on the topmost second die D2-*n*, but is not limited thereto. In some alternative embodiments, the cap substrate 200 may be bonded on the third die D3 after the third die D3 is stacked on the topmost second die D2-*n*.

A surface of the topmost second die D2-*n* that faces the third die D3 may include convex portions CP1 at positions where the second through semiconductor vias TSV2 are positioned in the topmost second die D2-*n* (as shown in FIG. 1B). In some embodiments, ends of the second through semiconductor vias TSV2 in the topmost second die D2-*n* that face the third die D3 may define parts of the convex portions CP1. In some embodiments, the surface of the topmost second die D2-n that faces the third die D3 may have a concave-convex shape that is consistently repeated like a surface shape of a wave in regions where the second through semiconductor vias TSV2 are positioned. As the number of second dies D2-1 to D2-n stacked on the first die D1 increases, the magnitude of each convex portion CP1 at the surface of the topmost second die D2-n become larger.

In the case where the cap substrate 200 is bonded on the third die D3 before the third die D3 is stacked on the topmost second die D2-n, an interface between the topmost second die D2-n and the third die D3 with the cap substrate 200 disposed thereon (hereinafter, a final cap D3') is likely to generate voids resulted from the significant difference of warpage values between the final cap D3' and the topmost second die D2-n among the second dies D2-1 to D2-n stacked on the first die D1. Some of deficiencies, such as an electrical connection failure, may occur due to the voids generated in the interface between the topmost second die D2-n and the final cap D3'. In some embodiments, when the number of second dies is larger than 5 (i.e., die stack 100 includes second dies D2-1 to D2-5), the magnitude of each convex portion CP1 at the surface of the topmost second die D2-n may be large enough to cause voids generated in the interface between the topmost second die D2-n and the final cap D3' while the final cap D3' is stacked on the topmost second die D2-n.

As such, with reference to FIG. 2, when a thickness t1 of the final cap D3' (which is a sum of a thickness t2 of the cap substrate 200 and a thickness t3 of the third die D3) decreases, an absolute value of a warpage value of the final cap D3' increases. FIG. 2 shows two different ranges with different slope. The absolute value of the warpage value slightly increase from about 16 μm to about 23 μm when the thickness is decreased from about 100 μm to about 80 μm, and the absolute value of the warpage value significantly increase from about 23 μm to about 65 μm when the thickness is decreased from about 80 μm to about 40 μm. In view of the above, the final cap C3' is designed to have a thickness t1 ranging from about 50 μm to about 80 μm because the warpage value can be adjusted easily within a range with large slope. For instance, under the circumstance that the first die D1, the second dies D2-1 to D2-n, and the third die D3 may each independently have a thickness of about 40 μm, for example, the absolute value of the warpage value of the topmost second die D2-n among the second dies D2-1 to D2-n stacked on the first die D1 may be about 65 μm. As such, the thickness t1 of the final cap D3' may be designed to range from about 50 μm to about 80 μm to approach the warpage value of the topmost second die D2-n, so that the voids generated in the interface between the topmost second die D2-n and the final cap D3' can be avoided, and the reliability of the electrical connection between the topmost second die D2-n and the third die D3 can be secured.

In some embodiments, the first die D1, the second dies D2-1 to D2-n, and the third die D3 may each independently have a thickness of about 40 μm to about 50 μm, and the cap substrate 200 may have a thickness of about 10 μm to about 30 μm. In some embodiments, the thickness of the final cap D3' may be adjusted by reducing the thickness of the cap substrate 200. Generally, the cap substrate 200 may be designed to have a thickness t2 larger than a thickness t3 of the third die D3 in the conventional die stack. For example, when the thickness t3 of the third die D3 is about 40 μm, the thickness t2 of the cap substrate 200 may be about 110 μm. The thickness t2 of the cap substrate 200 may be reduced from about 110 μm to fall within the range from about 10 μm to about 30 μm by any suitable method such as grinding before the final cap D3' is bonded on the topmost second die D2-n.

In the case where the cap substrate 200 is bonded on the third die D3 after the third die D3 is stacked on the topmost second die D2-n, a surface of the third die D3 that faces the cap substrate 200 may have a concave-convex shape that is consistently repeated like a surface shape of a wave in regions where the third through semiconductor vias TSV3 are positioned. For example, with reference to FIG. 1B, the surface of the third die D3 that faces the cap substrate 200 includes convex portions CP2 at positions where the third through semiconductor vias TSV3 are located. In some embodiments, ends of the third through semiconductor vias TSV3 that face the cap substrate 200 may define some parts of the convex portions CP2. As the number of second die D2-1 to D2-n on which the third die D3 is disposed increases, the magnitudes of the convex portions CP2 at the surface of the third die D3 are increased accordingly. As such, an interface between the third die D3 and cap substrate 200 is likely to generate voids resulted from the significant difference of warpage values between the cap substrate 200 and the third die D3 stacked on the second dies D2-1 to D2-n. Some of undesired results may occur due to the voids generated in the interface between the cap substrate 200 and the third die D3. As such, the cap substrate 200 may be designed to have a thickness t2 smaller than the thickness t3 of the third die D3 to approach the warpage value of the third die D3 stacked on the second dies D2-1 to D2-n, so that the voids generated in the interface between the cap substrate 200 and the third die D3 can be avoided.

In some embodiments, the first die D1, the second dies D2-1 to D2-n, and the third die D3 may each independently have a thickness of about 40 μm to about 50 μm, and the cap substrate 200 may have a thickness of about 10 μm to about 30 μm. Generally, the cap substrate 200 may be designed to have a thickness t2 larger than a thickness t3 of the third die D3 in the conventional die stack. For example, when the thickness t3 of the third die D3 is about 40 μm, the thickness t2 of the cap substrate 200 may be about 110 μm. The thickness of the cap substrate 200 may be reduced from about 110 μm to fall within the range from about 10 μm to about 30 μm by any suitable method such as grinding before bonding on the third die D3.

In some embodiments, the interface between the third die D3 and the topmost second die D2-n among the second dies D2-1 to D2-n or between the cap substrate 200 and third die D3 includes a void-free interface. The void-free interface may be defined as a void with a size larger than 10 μm is not observed in the interface.

The cap substrate 200 includes a first surface facing the third die D3 and a second surface opposite to the first surface, and the third die D3 includes a third surface facing the second dies D2-1 to D2-n and a fourth surface opposite to the third surface and facing the cap substrate 200. In some embodiments, the topography of the second surface of the cap substrate 200 is substantially identical to the topography of the third surface of the third die D3. In some alternative embodiments, the topography of the second surface of the cap substrate 200 is substantially identical to the topography of the first surface of the cap substrate 200. In some other embodiments, the topography of the second surface of the cap substrate 200, the topography of the first surface of the cap substrate 200, the topography of the third surface of the third die D3, and the topography of the fourth surface of the third die D3 are substantially identical to each other.

In some embodiments, the third die D3 includes electrical connection paths different from electrical connection paths of the second dies D2-1 to D2-n. For example, the third die D3 includes lateral electrical connection paths and vertical electrical connection paths. The lateral electrical connection paths electrically connect one third through semiconductor via TSV3 among the third through semiconductor vias TSV3 in the third die D3 to another one third through semiconductor via TSV3 among the third through semiconductor vias TSV3 in the third die D3. The vertical electrical connection paths electrically connect the third through semiconductor vias TSV3 of the third die D3 to the second through semiconductor vias TSV2 of the topmost second dies D2-n. The second dies D2-1 to D2-n include vertical electrical connection paths which can electrically connect the two adjacent second dies D2-1 to D2-n, electrically connect the topmost second die D2-n to the third die D3, or electrically connect the bottommost second die D2-1 to the first die D1. In this case, the third die D3 may include electrical connection paths different from electrical connection paths of the first die D1. For example, the first die D1 includes vertical electrical connection paths to electrically connect the first through semiconductor vias TSV1 of the first die D1 to the second through semiconductor vias TSV2 of the bottommost second die D2-1.

The third die D3 may include a connection structure 110 in the case where the third die D3 includes the lateral electrical connection paths and the vertical electrical connection paths. The connection structure 110 may be disposed on ends of the third through semiconductor vias TSV3 that face the cap substrate 200. The connection structure 110 may provide the lateral electrical connection paths to electrically connect one third through semiconductor via TSV3 among the third through semiconductor vias TSV3 in the third die D3 to another one third through semiconductor via TSV3 among the third through semiconductor vias TSV3 in the third die D3. In some embodiments, the connection structure 110 may be formed on the ends of the third through semiconductor vias TSV3 that face the cap substrate 200 after the third die D3 is stacked on the topmost second die D2-n, but is not limited thereto. In some alternative embodiments, the connection structure 110 may be formed on ends of the third through semiconductor vias TSV3 that face the cap substrate 200 before the third die D3 is stacked on the topmost second die D2-n. The thickness of the connection structure 110 is too small to affect the warpage value of the third die t3.

In some embodiments, the connection structure 110 may include pads 1102, an insulation layer, 1104, a redistribution layer 1106, and an insulation layer 1108. The pads 1102 are disposed on and electrically connected to the ends of the third through semiconductor vias TSV3 that face the cap substrate 200. The insulation layer 1104 is disposed on the pads 1102 and on the dielectric layer surrounding the third through semiconductor vias TSV3 of the third die D3. The redistribution layer 1106 is electrically connected to the pads 1102 and includes vias 1106a disposed in the insulation layer 1104 and wiring patterns 1106b disposed on the insulation layer 1104. The insulation layer 1108 is disposed on the insulation layer 1104 and covers the redistribution layer 1106.

The pads 1102 may include conductive materials such as metals or metal alloys including one or more of Al, AlCu, Cu, Ti, TiN, W, and the like. The pads 1102 may be formed by any suitable method, such as chemical vapor deposition (CVD), physical vapor deposition (PVD), or the like. The insulation layer 1104 may include an organic material or an inorganic material. For example, the organic material may be a photo-sensitive material such as polybenzoxazole (PBO), polyimide, benzocyclobutene (BCB), or the like. The inorganic material may be a silicon oxide, silicon nitride, silicon carbide, silicon oxynitride, or the like. The insulation layer 1104 may be formed by any suitable method, such as chemical vapor deposition (CVD), coating, or the like. The redistribution layer 1106 may include conductive materials such as metals or metal alloys including one or more of Al, AlCu, Cu, Ti, TiN, W, and the like. The redistribution layer 1106 may be formed by any suitable method, such as chemical vapor deposition (CVD), physical vapor deposition (PVD), or the like. The redistribution layer 1106 and pads 1102 may be formed of the same material or different materials. The insulation layer 1108 may include an organic material or an inorganic material. For example, the organic material may be a photo-sensitive material such as PBO, polyimide, BCB, or the like. The inorganic material may be a silicon oxide, silicon nitride, silicon carbide, silicon oxynitride, or the like. The insulation layer 1108 and the insulation layer 1104 may be formed of the same material or different materials. The insulation layer 1108 may be formed by any suitable method, such as chemical vapor deposition (CVD), coating, or the like.

In some alternative embodiments, with reference to FIG. 3, the first die D1 includes electrical connection paths different from electrical connection paths of the second dies D2-1 to D2-n. For example, the first die D1 includes lateral electrical connection paths and vertical electrical connection paths. The lateral electrical connection paths electrically connect one first through semiconductor via TSV1 among the first through semiconductor vias TSV1 in the first die D1 to another one first through semiconductor via TSV1 among the first through semiconductor vias TSV1 in the first die D1. The vertical electrical connection paths electrically connect the first through semiconductor vias TSV1 of the first die D1 to the second through semiconductor vias TSV2 of the bottommost second dies D2-1. The second dies D2-1 to D2-n include vertical electrical connection paths which can electrically connect the two adjacent second dies D2-1 to D2-n, electrically connect the topmost second die D2-n to the third die D3, or electrically connect the bottommost second die D2-1 to the first die D1. In this case, the first die D1 may include electrical connection paths different from electrical connection paths of the third die D3. For example, the third die D3 includes vertical electrical connection paths to electrically connect the third through semiconductor vias TSV3 of the third die D3 to the second through semiconductor vias TSV2 of the topmost second die D2-n.

The first die D1 may include a connection structure 110 in the case where the first die D3 includes the lateral electrical connection paths and the vertical electrical connection paths. The connection structure 110 may be disposed on ends of the first through semiconductor vias TSV1 away from the bottommost second die D2-1 among the second dies D2-1 to D2-n. The connection structure 110 provides the lateral electrical connection paths to electrically connect one first through semiconductor via TSV1 among the first through semiconductor vias TSV1 in the first die D1 to another one first through semiconductor via TSV1 among the first through semiconductor vias TSV1 in the first die D1. In some embodiments, the connection structure 110 may be formed on the ends of the first through semiconductor vias TSV1 away from the bottommost second die D2-1 after the cap substrate 200 is stacked on the third die D3, but is not limited thereto. In some alternative embodiments, the connection structure 110 may be formed on the ends of the first through semiconductor vias TSV1 away from the bottommost second die D2-1 before the bottommost second die D2-1 is stacked on the first die D1.

In some embodiments, the semiconductor device 10 may further include a passivation layer 300 disposed on the first die D1. Referring to FIG. 1A, in the case where the third die D3 includes the connection structure 110, the passivation layer 300 may be directly disposed on a surface of the first dies D1 that is opposite to a surface facing the second dies D2-1 to D2-n. Referring to FIG. 3, in the case where the first die D1 includes the connection structure 110, the passivation layer 300 may be disposed on the connection structure 110.

In some embodiments, the passivation layer 300 may be formed of inorganic materials such as silicon oxide, silicon nitride, silicon carbide, silicon oxynitride, silicon oxy-carbo-nitride, un-doped silicate glass (USG), or multiplayers thereof. The passivation layer 300 may be a single layer or a composite layer, and may be formed of a non-porous material. For example, the passivation layer 300 may be a composite layer including a silicon oxide layer and a silicon nitride layer over the silicon oxide layer, but is not limited thereto. The passivation layer 300 may have the function of blocking moisture and detrimental chemicals from accessing the conductive members such as redistribution layers or through semiconductor vias. The passivation layer 300 may be formed by any suitable method such as chemical vapor deposition (CVD).

In some embodiments, the semiconductor device 10 may further include electrical connectors 400 to electrically connect the semiconductor device 10 to other devices such as an interposer substrate. For example, the electrical connectors 400 may electrically connect the first through semiconductor vias TSV1 to the conductive members configured in the interposer substrate. The electrical connectors 400 may include conductive material such as metals or metal alloys including one or more of Al, Cu, Ag, Sn, Au, Ni, Pb, Ti, and the like. Each of the electrical connectors 400 may be formed as a multilayer or single layer structure. When the electrical connectors 400 are formed as a multilayer structure, the electrical connectors may include a copper (Cu) pillar and a solder. When the electrical connectors 400 are formed as a single layer structure, the electrical connectors 400 may include a tin-silver solder or copper (Cu). However, this is only an example, and the electrical connectors 400 are not limited thereto. In some embodiments, the electrical connectors 400 may be micro-bumps (hereinafter, micro-bumps 400) protruding beyond the passivation layer 300, and the micro-bumps 400 may be bonded to the first through semiconductor vias TSV1 through metal-to-metal direct bonding or solder bonding.

Figure 4A:
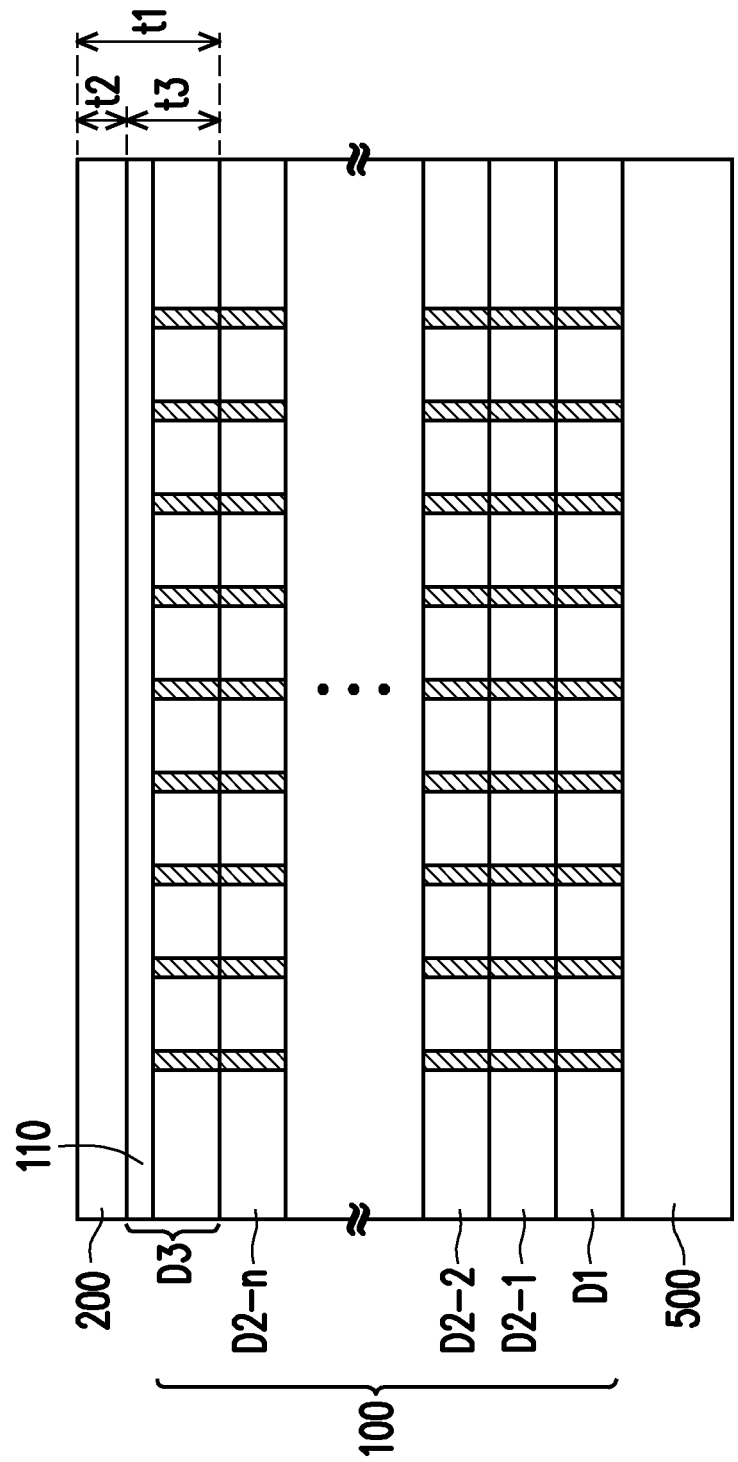
FIG. 4A and FIG. 4B are schematic cross-section views illustrating a method of forming a semiconductor device in accordance with a first embodiment.
Figure 4B:
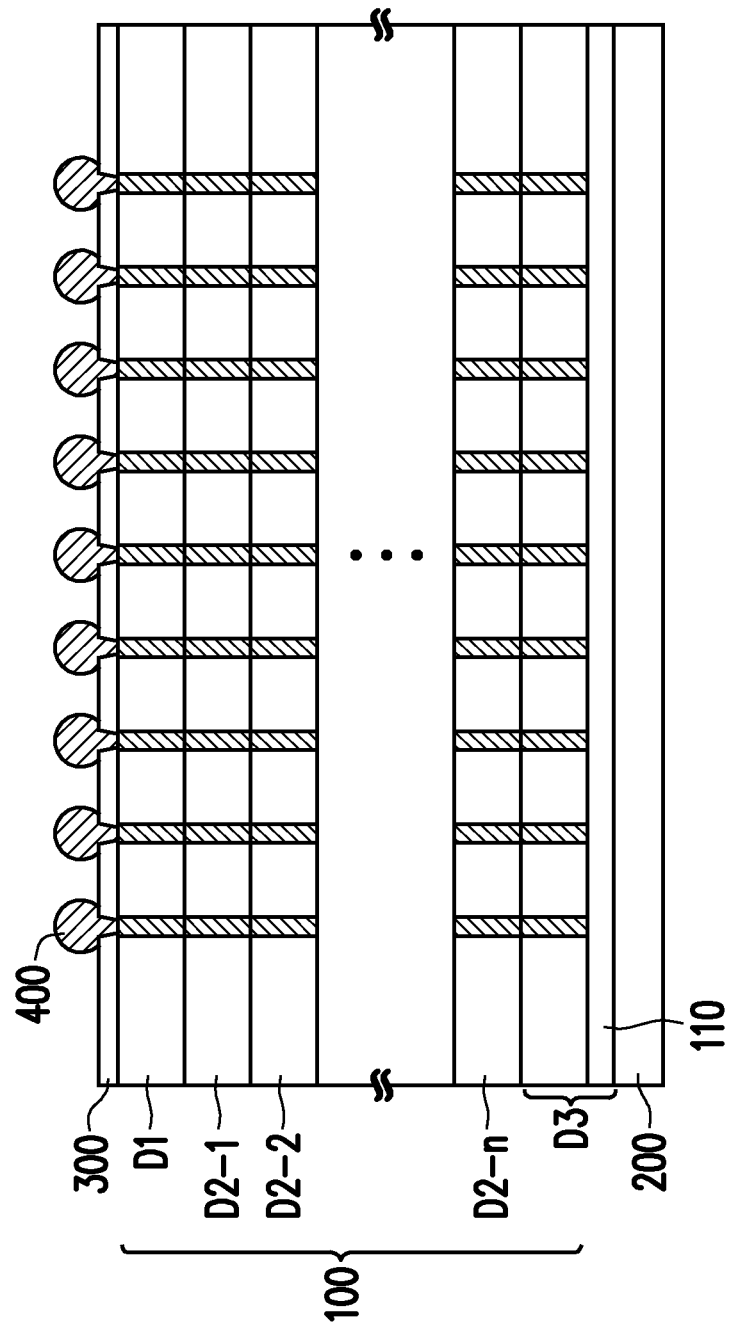

In the following, a method of forming the semiconductor device 10 in accordance with the first embodiment is described with reference to FIGS. 4A and 4B, but is not limited thereto. FIG. 4A and FIG. 4B are schematic cross-section views illustrating a method of forming a semiconductor device in accordance with a first embodiment.

Referring to FIG. 4A, the first die D1 including first through semiconductor vias TSV1 is stacked on a carrier 500. The carrier 500 may be a glass carrier, a silicon wafer, an organic carrier, or the like. The carrier 500 may include a release layer (not illustrated) formed of a polymer-based material (such as a light to heat conversion (LTHC) material), which may be removed along with carrier 500 from the overlying structures that will be formed in subsequent steps.

Then, the second dies D2-1 to D2-n are stacked on the first die D1 in sequence. The second dies D2-1 to D2-n are stacked on each other, and each of the second dies D2-1 to D2-n includes second through semiconductor vias TSV2.

A first bonding interface between the bottommost second die D2-1 and the first die D1 may include metal-to-metal bonding interfaces. For example, the second through semiconductor vias TSV2 of the bottommost second die D2-1 are bonded to the first through semiconductor vias TSV1 of the first die D1 through metal-to-metal direct bonding or solder bonding. The first bonding interface may include dielectric-to-dielectric bonding interfaces. For example, a dielectric layer surrounding the second through semiconductor vias TSV2 of the bottommost second die D2-1 is bonded to a dielectric layer surrounding the first through semiconductor vias TSV1 of the first die D1 through dielectric-to-dialectic bonding or fusion bonding. The first interfaces between the bottommost second die D2-1 and the first die D1 may include the metal-to-metal bonding interfaces and/or the dielectric-to-dielectric bonding interfaces.

A second bonding interface between the two adjacent second die D2-1 to D2-2 (e.g., second ides D2-1 and D2-2) may include metal-to-metal bonding interfaces. For example, the second through semiconductor vias TSV2 of the bottommost second die D2-1 are bonded to the second through semiconductor vias TSV2 of the second die D2-2 adjacent to the bottommost second die D2-1 through metal-to-metal direct bonding or solder bonding. The second bonding interface may include dielectric-to-dielectric bonding interfaces. For example, a dielectric layer surrounding the second through semiconductor vias TSV2 of the bottommost second die D2-1 is bonded to a dielectric layer surrounding the second through semiconductor vias TSV2 of the second die D2-2 adjacent to the bottommost second die D2-1 through dielectric-to-dialectic bonding or fusion bonding. The second interfaces between the two adjacent second die D2-1 to D2-2 may include the metal-to-metal bonding interfaces and/or the dielectric-to-dielectric bonding interfaces.

Next, a third die D3 including third through semiconductor vias TSV3 is stacked on the topmost second die D2-n among the second dies D2-1 to D2-n. In the case where the third die D3 includes a connection structure 110, the connection structure 110 is formed on the ends of the third through semiconductor vias TSV3 away from the topmost second dies D2-n before or after the third die D3 is stacked on the topmost second die D2-n.

In some embodiments, a cap substrate 200 with a thickness t2 ranging from about 10 µm to about 30 µm is bonded on the third die D3 after the third die D3 is stacked on the topmost second die D2-n among the second dies D2-1 to D2-n. In some alternative embodiments, the cap substrate 200 with a thickness t2 ranging from about 10 µm to about 30 µm is bonded on the third die D3 before the third die D3 is stacked on the topmost second die D2-n among the second dies D2-1 to D2-n. For example, the cap substrate 200 is bonded on the third die D3 to form a final cap (herein after final cap D3'), and then the final cap D3' with a thickness t1 ranging from about 50 µm to about 80 µm is bonded on the topmost second die D2-n in the subsequent step. In some embodiments, the final cap D3' may be formed by following steps. Firstly, the third die D3 is bonded on a surface of the cap material substrate (not illustrated). Then, a thickness of the cap material substrate is reduced to form the final cap D3' with a thickness ranging from about 50 µm to about 80 µm. The thickness of the cap material substrate may be reduced by performing a grinding process on a surface opposite to the surface on which the third die D3 is disposed. The third die D3 may have a thickness ranging from about 40 µm to about 50 µm, so the thickness of the cap material substrate can be reduced to about 10 µm to about 30 µm. The remaining cap material substrate may be referred to as the cap substrate 200.

A third bonding interface between the topmost second die D2-*n* and the third die D3 may include metal-to-metal bonding interfaces. For example, the second through semiconductor vias TSV2 of the topmost second die D2-*n* are bonded to the third through semiconductor vias TSV3 of the third die D3 through metal-to-metal direct bonding or solder bonding. The third bonding interface may include dielectric-to-dielectric bonding interfaces. For example, a dielectric layer surrounding the second through semiconductor vias TSV2 of the topmost second die D2-*n* is bonded to a dielectric layer surrounding the third through semiconductor vias TSV3 of the third die D3 through dielectric-to-dielectric bonding or fusion bonding. The third interfaces between the topmost second die D2-*n* and the third die D3 may include the metal-to-metal bonding interfaces and/or the dielectric-to-dielectric bonding interfaces.

In the case where the cap substrate 200 is bonded on the third die D3 after the third die D3 is stacked on the topmost second die D2-*n* among the second dies D2-1 to D2-*n*. The cap substrate 200 is bonded to a first surface of the third die D3 that includes convex portions CP2 (as shown in FIG. 1B) in the subsequent step. Due to the cap substrate 200 has a thickness ranging from about 10 µm to about 30 µm, the cap substrate 200 can approach the topography of the first surface of the third die D3. That is, a surface of the cap substrate 200 that bonds to the third die D3 may include convex portions CP3 substantially formed at positions between the convex portions CP2 of the first surface of the third die D3 after the cap substrate 200 is bonded on the third die D3. A bonding interface between the cap substrate 200 and the third die D3 may be a void free interface.

In the case where the cap substrate 200 is bonded on the third die D3 before the third die D3 is stacked on the topmost second die D2-*n* among the second dies D2-1 to D2-*n*. In this case, the third die D3 with cap substrate 200 bonded thereon (hereinafter final cap D3') is bonded to a second surface of the topmost second die D2-*n* that includes convex portions CP1 (as shown in FIG. 1B) in the subsequent step. Due to the final cap D3' has a thickness t1 ranging from about 50 µm to about 80 µm, the final cap D3' can approach the topography of the second surface of the topmost second die D2-*n* among the second die D2-1 to D2-*n* disposed on the first die D1. That is, a surface of the final cap D3' that bonds to the topmost second die D2-*n* may include convex portions CP4 substantially formed at positions between the convex portions CP1 of the second surface of the topmost second die D2-*n* after the final cap D3' is bonded on the topmost second die D2-*n*. A bonding interface between the final cap D3' and the topmost second die D2-*n* may be a void free interface.

Referring to FIG. 4B, after the cap substrate 200 is stacked on the third die D3 or the final cap D3' is stacked on the topmost second dies D2-1, the carrier 500 is removed. Then, the die stack 100 flips over and a passivation layer 300 is formed on a surface of the first die D1 that is opposite to a surface where the second dies D2-1 to D2-*n* is stacked. Next, electrical connectors 400 electrically connected to the first through semiconductor vias TSV1 are formed on the passivation layer 300. The electrical connectors 400 may be micro-bumps (hereinafter, micro-bumps 400) protruding beyond the passivation layer 300, and the micro-bumps 400 may be bonded to the first through semiconductor vias TSV1 through metal-to-metal direct bonding or solder bonding.

Figure 5:
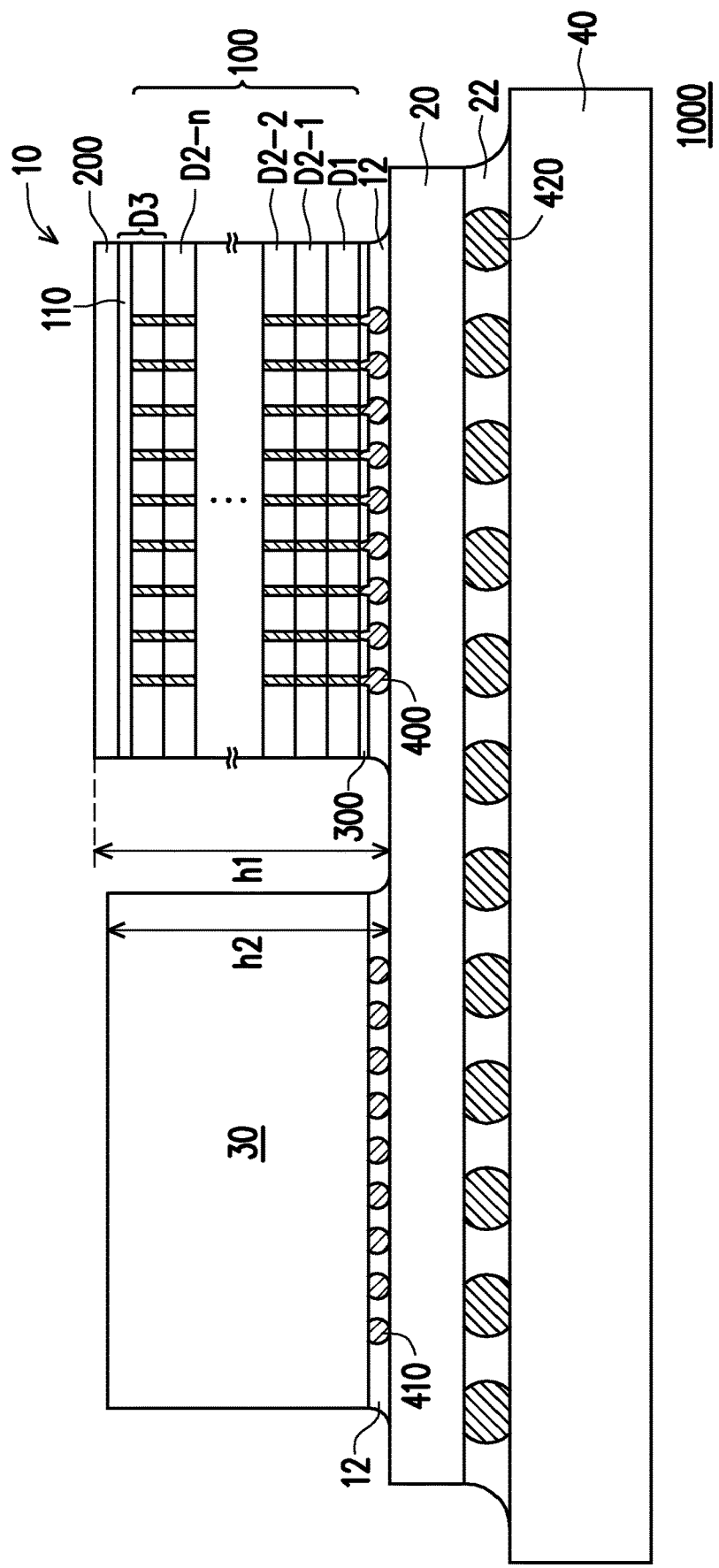
FIG. 5 is a schematic cross-section view illustrating a semiconductor package in accordance with a first embodiment.
Figure 6:
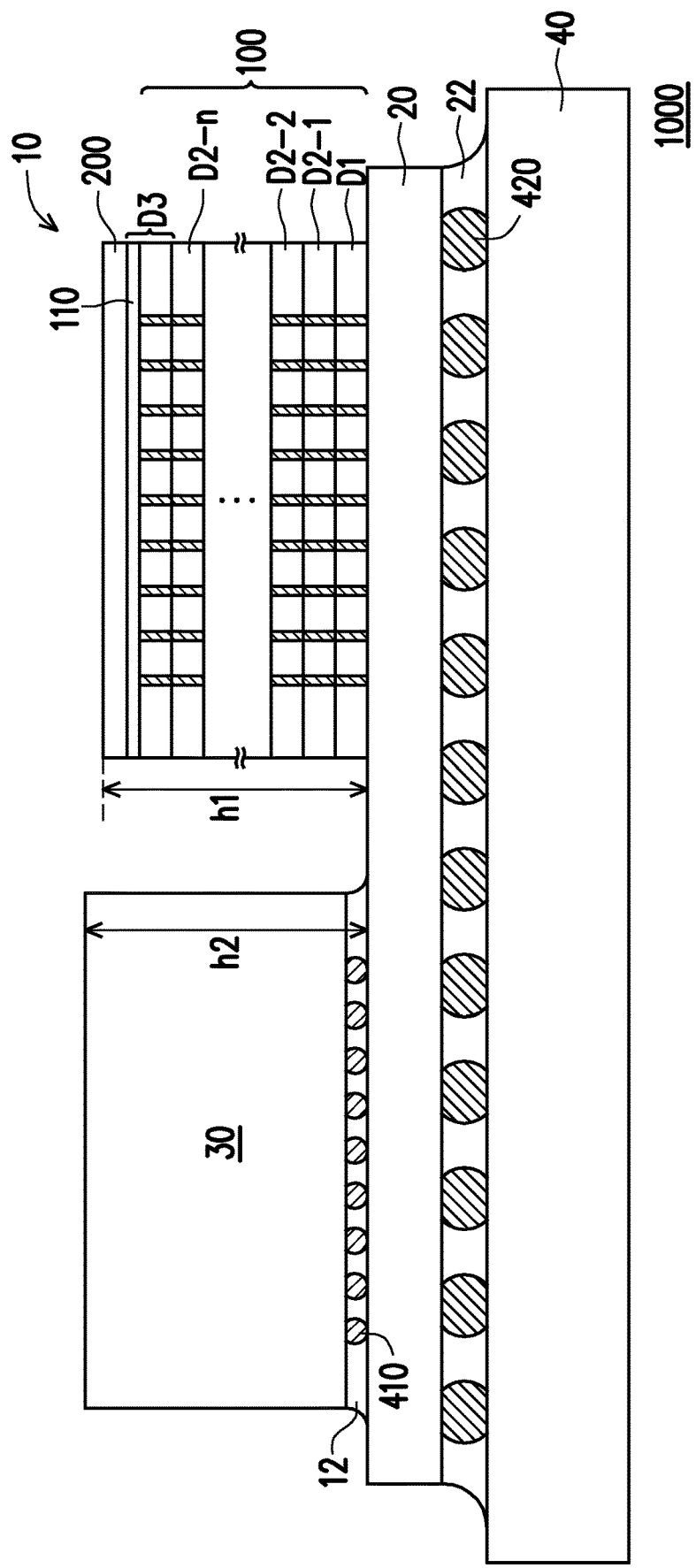
FIG. 6 is a schematic cross-section view illustrating a semiconductor package in accordance with a second embodiment.

FIG. 5 is a schematic cross-section view illustrating a semiconductor package in accordance with a first embodiment. FIG. 6 is a schematic cross-section view illustrating a semiconductor package in accordance with a second embodiment.

Referring to FIG. 5, the semiconductor package 1000 may include a semiconductor device 10 and an interposer substrate 20. The semiconductor device 10 is disposed on the interposer substrate 20. In some embodiment, the semiconductor device 10 may be a memory die stack (hereinafter, memory die stack 10) such a high bandwidth memory (HBM) stack. The structures, materials, and processes related to the semiconductor device 10 may be similar or identical to what are shown in, and discussed referring to, FIG. 1A. The details are thus no repeated herein. The memory die stack 10 is electrically connected to the interposer substrate 20. In some embodiment, the memory die stack 10 is electrically connected to the interposer substrate 20 through the electrical connectors 400. For example, the electrical connectors 400 are in contact with conductive members (not illustrated) configured in the interposer substrate 20. In some alternative embodiments, with reference to FIG. 6, the through semiconductor vias of a bottommost memory die (e.g., the first through semiconductor vias TSV1 of the first die D0 are in contact with the conductive members (not illustrated) configured in the interposer substrate 20. A bonding interface between the interposer substrate 20 and the memory die stack 10 may include metal-to-metal bonding interfaces and/or dielectric-to-dielectric bonding interfaces.

In the case where the memory die stack 10 is electrically connected to the interposer substrate 20 through the electrical connectors 400, the semiconductor package 1000 may include an underfill 12 disposed between the memory die stack 10 and the interposer substrate 20. The underfill 12 may surround the electrical connectors 400 and fill the spaces between the electrical connectors 400. In some embodiments, the underfill 12 may cover sidewalls of the passivation layer 300. In some alternative embodiments, the underfill 12 may cover portions of sidewalls of the bottommost memory die among the memory dies of the memory die stack 10. In some embodiments, the underfill 12 may have inclined sidewalls with respect to sidewalls of the memory die stack 10. The material of the underfill 12 is not particularly limited, but may be, for example, an organic insulation material, an inorganic insulation material, or a combination thereof. In the case where the through semiconductor vias of the bottommost memory die (e.g., the first through semiconductor vias TSV1 of the first die D0 are directly in contact with the conductive members (not illustrated) configured in the interposer substrate 20, the passivation layer 300 and the underfill 12 may be omitted, but is not limited thereto.

In some embodiments, the semiconductor package 1000 further includes devices 30 such as a central processing unit (CPU), a system-on-chip (SoC) or a graphic processing unit (GPU) disposed on the interposer substrate 20 and spaced apart from the memory die stack 10. The memory die stack 10 may have a height h1 similar or identical to a height h2 of the devices 30 with reference to a surface of the interposer substrate 20 where the memory die stack 10 and the devices 30 are disposed. The devices 30 may include electrical connectors 410 to electrically connect the devices 30 to the interposer substrate 20. The electrical connectors 410 may be micro-bumps, but are not limited thereto. The devices 30 may electrically connected to the memory die stack 10 through the conductive members (not illustrated) configured in the interposer substrate 20. The underfill 12 may surround the electrical connectors 410 and fill the spaces between the electrical connectors 410.

In some embodiments, the semiconductor package 1000 further includes a printed circuit board (PCB) 40 disposed under the interposer substrate 20. The interposer substrate 20 is electrically connected to the PCB 40 through electrical connectors 420. The electrical connectors 420 may be controlled collapse chip connection (C4) bumps, but are not limited thereto. In some embodiments, some of memory dies in the memory die stack 10 are electrically connected to the devices 30, and the others of memory dies in the memory die stack 10 are electrically connected to the PCB 40.

The semiconductor package 1000 further includes a underfill 22 disposed between the interposer substrate 20 and the PCB 40. The underfill 22 may surround the electrical connectors 420 and fill the spaces between the electrical connectors 420. In some embodiments, the underfill 22 may have inclined sidewalls with respect to sidewalls of the interposer substrate 20. The material of the underfill 22 is not particularly limited, but may be, for example, an organic insulation material, an inorganic insulation material, or a combination thereof.

According to some embodiments, a semiconductor device includes a die stack and a cap substrate. The die stack includes a first die, second dies stacked on the first die, and a third die stacked on the second dies. The first die includes first through semiconductor vias. Each of the second dies include second through semiconductor vias. The third die includes third through semiconductor vias. The cap substrate is disposed on the third die of the die stack. A sum of a thickness of the third die and a thickness of the cap substrate ranges from about 50 μm to about 80 μm.

According to some embodiments, a semiconductor package includes a memory die stack and an interposer substrate. The memory die stack includes memory dies stacked on each other and a cap substrate disposed on the memory dies. Each of the memory dies includes through semiconductor vias, and the memory dies are electrically connected with each other by through semiconductor vias. A thickness of the cap substrate ranges from about 10 μm to about 30 μm. The memory die stack is disposed on the interposer substrate.

According to some embodiments, a method of forming a semiconductor device includes following steps. Second dies are stacked on a first die. The second dies are stacked on each other, and the first dies includes first through semiconductor vias, and each of second dies includes second through semiconductor vias. A third die is stacked on the second dies. The third die includes third through semiconductor vias. A cap substrate with a thickness ranging from about 10 μm to about 30 μm is bonded on the third die. A first surface of the third die that faces the cap substrate includes first convex portions substantially formed at positions where the third through semiconductor vias are located. A second surface of the cap substrate that bonds to the third die includes second convex portions substantially formed at positions between the first convex portions of the first surface after the cap substrate is bonded on the third die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a die stack comprising:
      a first die comprising first through semiconductor vias;
      second dies stacked on the first die, and each of the second dies comprise second through semiconductor vias; and
      a third die stacked on the second dies and comprising third through semiconductor vias; and
   a cap substrate disposed on the third die of the die stack,
      wherein a surface of a topmost second die among the second dies that faces the third die comprises convex portions at positions where the second through semiconductor vias are configured in the topmost second die.

2. The semiconductor device of claim 1, wherein the thickness of the cap substrate ranges from about 10 μm to about 30 μm.

3. The semiconductor device of claim 1, wherein the third die comprises electrical connection paths different from electrical connection paths of the second dies.

4. The semiconductor device of claim 3, wherein the third through semiconductor vias comprise first ends facing the cap substrate and second ends facing the second dies, the third die comprises a redistribution layer disposed on the first ends of the third through semiconductor vias, and the redistribution layer electrically connects one third through semiconductor via among the third through semiconductor vias to another one third through semiconductor via among the third through semiconductor vias.

5. The semiconductor device of claim 1, wherein the first die comprises electrical connection paths different from electrical connection paths of the second dies.

6. The semiconductor device of claim 5, wherein the first through semiconductor vias comprise first ends facing the second dies and second ends opposite to the first ends, and the first die comprises a redistribution layer disposed on the first ends of the first through semiconductor vias, and the redistribution layer electrically connects one first through semiconductor via among the first through semiconductor vias to another one first through semiconductor via among the first through semiconductor vias.

7. The semiconductor device of claim 1, wherein the cap substrate comprises a first surface facing the third die and a second surface opposite to the first surface, and the third die comprises a third surface facing the second dies and a fourth surface opposite to the third surface and facing the cap substrate, the topography of the second surface of the cap substrate is substantially identical to the topography of the first surface of the cap substrate or the topography of the third surface of the third die.

8. The semiconductor device of claim 1, wherein an interface between the third die and a topmost second die among the second die or between the cap substrate and the third die comprises a void-free interface.

9. The semiconductor device of claim 1, wherein a sum of a thickness of the third die and a thickness of the cap substrate ranges from about 50 μm to about 80 μm.

10. The semiconductor device of claim 1, wherein the second through semiconductor vias of the two adjacent second dies are in contact with each other, second through semiconductor vias in a bottommost second die among the second dies are in contact with the first through semiconductor vias of the first die, and second through semiconductor vias in a topmost second die among the second dies are in contact with the third through semiconductor vias of the third die.

11. A semiconductor package, comprising:
a memory die stack comprising:
memory dies stacked on each other, wherein each of the memory dies comprises through semiconductor vias, and the memory dies are electrically connected with each other by through semiconductor vias; and
a cap substrate disposed on the memory dies, wherein the cap substrate comprises a first surface facing the memory dies and a second surface opposite to the first surface, the topography of the first surface is substantially identical to the topography of the second surface; and
an interposer substrate, wherein the memory die stack is disposed on the interposer substrate.

12. The semiconductor package of claim 11, wherein a sum of the thickness of the cap substrate and a thickness of an outermost memory die on which the cap substrate is disposed among the memory dies ranges from about 50 μin to about 80 μm.

13. The semiconductor package of claim 11, wherein an outermost memory die among the memory dies comprises a redistribution layer on the through semiconductor vias of the outermost memory die, and the redistribution layer electrically connects one through semiconductor via among the through semiconductor vias of the outermost memory die to another one through semiconductor via among the through semiconductor vias of the outermost memory die.

14. The semiconductor package of claim 11, wherein a thickness of the cap substrate ranges from about 10 μm to about 30 μm.

15. The semiconductor package of claim 11, wherein an interface between an outermost memory die among the memory dies and a cap substrate comprises a void-free interface.

16. The semiconductor package of claim 11, wherein the through semiconductor vias of the two adjacent memory dies are in contact with each other.

17. The semiconductor package of claim 11, wherein the through semiconductor vias of a bottommost memory die among the memory dies are in contact with conductive members configured in the interposer substrate.

18. A method of forming a semiconductor device, comprising:
stacking second dies on a first die, wherein the second dies are stacked on each other, and the first dies comprises first through semiconductor vias, and each of second dies comprises second through semiconductor vias;
stacking a third die on the second dies, wherein the third die comprises third through semiconductor vias, wherein a surface of a topmost second die among the second dies that faces the third die comprises convex portions at positions where the second through semiconductor vias are configured in the topmost second die; and
bonding a cap substrate.

* * * * *